(12) United States Patent
Ju

(10) Patent No.: US 7,173,848 B2
(45) Date of Patent: Feb. 6, 2007

(54) MAGNETIC RANDOM ACCESS MEMORY WITH MEMORY CELL STACKS HAVING MORE THAN TWO MAGNETIC STATES

(75) Inventor: Kochan Ju, Monte Sereno, CA (US)

(73) Assignee: Meglabs, Inc., San Jose, CA (US)

( * ) Notice: Subject to any disclaimer, the term of this patent is extended or adjusted under 35 U.S.C. 154(b) by 39 days.

(21) Appl. No.: 11/048,377

(22) Filed: Feb. 1, 2005

(65) Prior Publication Data

US 2006/0171199 A1    Aug. 3, 2006

(51) Int. Cl.
*G11C 11/15*    (2006.01)
(52) U.S. Cl. ................. 365/173; 365/158; 365/171; 365/189.04
(58) Field of Classification Search ............. 365/130, 365/158, 171, 172, 173, 189.04
See application file for complete search history.

(56) References Cited

U.S. PATENT DOCUMENTS

| | | | |
|---|---|---|---|
| 5,465,185 A | 11/1995 | Heim et al. | |
| 5,640,343 A | 6/1997 | Gallagher et al. | |
| 5,930,164 A * | 7/1999 | Zhu | 365/158 |
| 6,169,689 B1 * | 1/2001 | Naji | 365/173 |
| 6,590,806 B1 | 7/2003 | Bhattacharyya | |
| 6,714,446 B1 * | 3/2004 | Engel | 365/171 |
| 6,801,451 B2 | 10/2004 | Tran et al. | |
| 6,829,162 B2 | 12/2004 | Hosotani | |
| 6,936,903 B2 * | 8/2005 | Anthony et al. | 257/422 |
| 6,937,497 B1 * | 8/2005 | Ju et al. | 365/130 |
| 6,956,764 B2 * | 10/2005 | Engel et al. | 365/158 |
| 6,992,910 B1 * | 1/2006 | Ju et al. | 365/130 |
| 7,054,186 B2 * | 5/2006 | Iwata | 365/158 |
| 2002/0036331 A1 | 3/2002 | Nickel et al. | |
| 2003/0161180 A1 | 8/2003 | Bloomquist et al. | |

OTHER PUBLICATIONS

Reohr et al., "Memories of Tomorrow", IEEE Circuits & Devices Magazine, Sep. 2002, pp. 17-27.
Pugh et al, IBM J. of Res & Develop, vol. 4, No. 2, 163.

* cited by examiner

*Primary Examiner*—Richard T. Elms
*Assistant Examiner*—Alexander Sofocleous

(57) ABSTRACT

A magnetic random access memory (MRAM) has memory units or stacks of multiple memory cells arranged in the X-Y plane on the MRAM substrate with each memory unit having four possible magnetic states. Each memory unit is located at an intersection region between two orthogonal write lines and has two stacked memory cells. The two cells are magnetically separated from each other by a separation layer and have the easy axes of magnetization of their free ferromagnetic layers aligned substantially orthogonal to one another. The application of write-current pulses of equal magnitude and the appropriate direction through the orthogonal write lines above and below the memory units can generate each of the four magnetic states which can be detected as four independent logical states.

21 Claims, 6 Drawing Sheets

MAGNETIC RANDOM ACCESS MEMORY WITH MEMORY CELL STACKS HAVING MORE THAN TWO MAGNETIC STATES

BACKGROUND OF THE INVENTION

1. Field of the Invention

This invention relates generally to magnetic random access memory (MRAM) and more particularly to MRAM with units or stacks of multiple memory cells for producing more than two logic states.

2. Description of the Related Art

MRAM with magnetic tunnel junction (MTJ) memory cells has been proposed for nonvolatile memory, as described in U.S. Pat. No. 5,640,343 and by Reohr et al., "Memories of Tomorrow", *IEEE CIRCUITS & DEVICES MAGAZINE,* September 2002, pp. 17–27. In these devices the MTJ cells are arranged as an array in a single layer (the X-Y plane) on a semiconductor substrate. In one type of architecture, called a 1T1MTJ MRAM (one transistor and one MTJ), each MTJ cell is located between a bit line and a transistor, with the word lines located beneath the MTJ cells. In another type of architecture, called a cross-point (XPC) MRAM, the MTJ cells are located directly between the bit and word lines.

In both MRAM architectures, a selected MTJ cell is programmed or "written", i.e., its magnetic state or +/−X magnetization direction is switched, by write currents passing in X and Y directions through the bit and word lines (the write lines) located above and below the selected MTJ cell. The write currents generate orthogonal magnetic fields in the X and Y directions that switch the magnetization direction of the selected MTJ cell. The typical writing scheme is a "half-select" scheme, where each of the bit and word lines generates half the required write field for switching the selected MTJ cell. However, the energized bit and word lines reduce the magnetic reversal energy barrier in the other cells along their respective bit and word lines. This makes these "half-selected" cells more susceptible to having their magnetic states switched when the selected cell is written.

MRAM with units or stacks of multiple memory cells located between the write lines to produce more than two magnetic states, and thus more than two logic states, have been proposed. Examples of this type of MRAM are described in U.S. Pat. Nos. 5,930,164; 6,169,689 B1; 6,590, 806 B1; and 6,801,451 B2; and in Published Patent Application US 2002/0036331 A1. In the prior art MRAM with multiple-memory-cell stacks, the write currents must be kept within relatively narrow margins to avoid writing cells in non-selected stacks. In addition, writing to the cells in a selected stack requires both a series of write pulses and write pulses with different current values, which increases both the complexity of the write circuitry and the time to write.

What is needed is an MRAM with multiple-memory-cell stacks that has increased write-current margins, less complex write circuitry and reduced write time.

SUMMARY OF THE INVENTION

The invention is an MRAM with memory units or stacks arranged in the X-Y plane on the MRAM substrate with each memory stack having two memory cells stacked along the Z axis. Each stack is located at an intersection region between the two orthogonal write lines. The first cell in the stack has its free layer easy axis of magnetization aligned parallel to either the X or Y axis and the second cell in the stack has its free layer easy axis of magnetization aligned substantially orthogonal to the easy axis of magnetization of the free layer of the first cell. The two cells in a stack are magnetically separated by a nonmagnetic separation layer.

Both cells are written at the same time by the application of write-current pulses of equal magnitude along orthogonal write lines. Each of the four possible magnetic states is selected by selecting the direction of write current.

The easy axis of magnetization of the free layer in each cell is the axis of anisotropy that can be induced by the shape of the cell or by the deposition process, such as deposition in an applied magnetic field or at an angle of incidence. If the anisotropy is induced during deposition, then the cells can have the same shape and matching perimeters, such as a circular shape. This allows the cells to be fabricated with the same lithographic patterning steps and permits the stacks to be packed closer together in the X-Y plane.

Each memory cell has an electrical resistance difference $\Delta R$ between the parallel and antiparallel alignment of its free and pinned layer magnetization directions. In one embodiment, the $\Delta R$ values of the two cells in a stack are different, so that each of the four possible magnetic states produced by the stack can be read by measuring the resistance across the stack. If the cells are magnetic tunnel junction (MTJ) cells, the $\Delta R$ values of the cells can be made different by fabricating the MTJ cells to have different tunnel barrier thicknesses.

For a fuller understanding of the nature and advantages of the present invention, reference should be made to the following detailed description taken together with the accompanying figures.

DETAILED DESCRIPTION OF THE INVENTION

Prior Art

Figure 1:
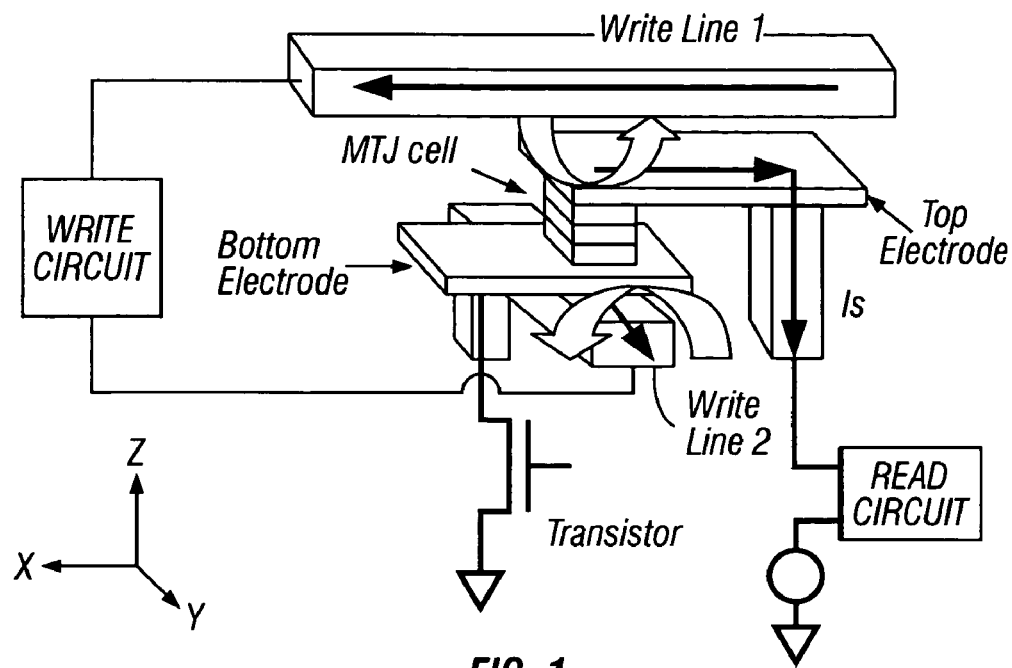
FIG. 1 is a perspective view of a portion of the prior art MRAM showing a single conventional MTJ memory cell and associated write and read circuitry.

FIG. 1 is a perspective view of a portion of the prior art a 1T1MTJ MRAM showing a single conventional MTJ memory cell, i.e., a memory cell with two magnetic states representing 0 and 1, with a free ferromagnetic layer whose magnetization direction is switched by application of current through the write lines. The MTJ cell is located in an intersection region between a second write line (WL2) (aligned along the Y axis) and a first write line (WL1) (aligned along the X axis). The write lines are connected to a write circuit that provides the current pulses to perform the writing. Only one MTJ cell and intersection region is depicted in FIG. 1, but in the MRAM there are a plurality of generally parallel second write lines and a plurality of generally parallel first write lines that are orthogonal to the second write lines and overlap to define a plurality of intersection regions. Each intersection region contains an MTJ cell. Each MTJ cell is electrically connected to a transistor that is formed on the MRAM substrate (not shown). In the embodiment of FIG. 1 each MTJ cell is electrically connected to top and bottom electrodes that provide connection to the transistor and the resistance detection or read circuit.

Figure 2:
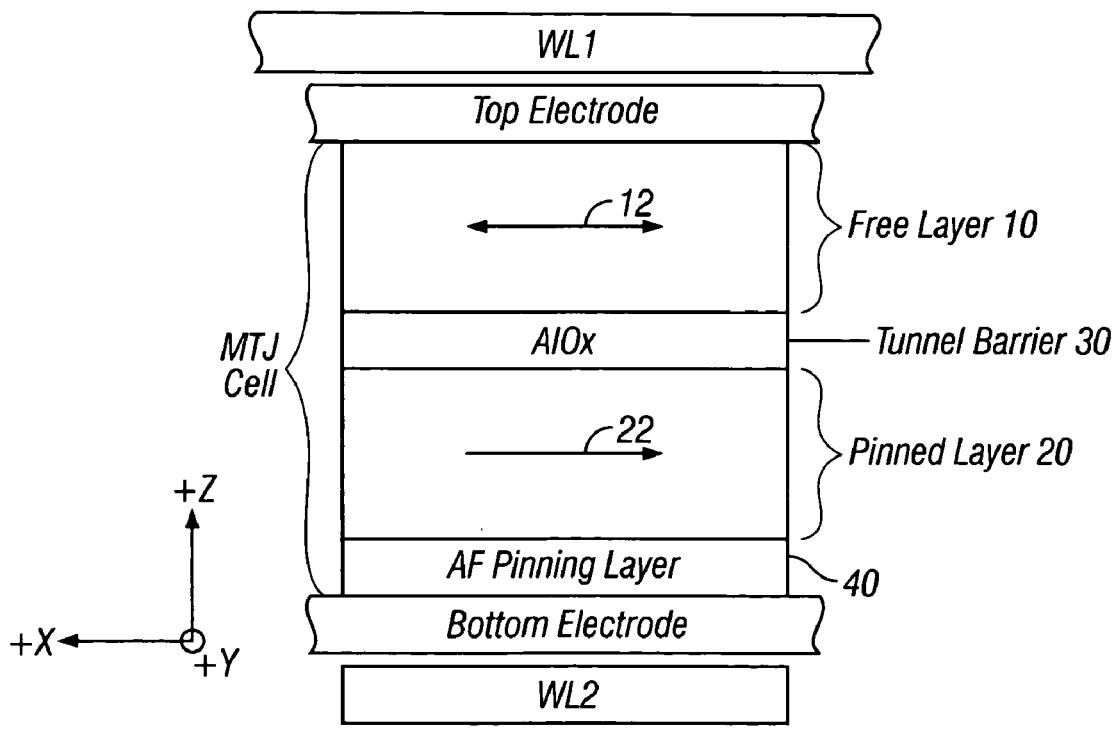
FIG. 2 is a sectional schematic showing the layers making up the prior art MTJ memory cell of FIG. 1.

FIG. 2 is a sectional schematic showing the layers making up the conventional MTJ cell. A free ferromagnetic layer 10 and a pinned ferromagnetic layer 20 are separated by a tunnel barrier 30, which is typically formed of alumina ($Al_2O_3$). The pinned ferromagnetic layer 20 has its magnetic moment or magnetization direction 22 pinned by being exchange coupled to antiferromagnetic (AF) pinning layer 40. The AF pinning layer 40 is typically a Mn alloy (e.g., PtMn, NiMn, FeMn, IrMn, PdMn, PtPdMn or RhMn). The pinned layer 20 may be a single ferromagnetic layer, as shown in FIG. 2, or a trilayer of a pinned ferromagnetic sublayer and a fixed ferromagnetic sublayer spaced apart by an antiferromagnetic coupling (AFC) layer, which is typically ruthenium (Ru). The trilayer type of pinned layer is the well-known antiparallel-pinned (AP-pinned) structure, also called a "laminated" pinned layer or a synthetic antiferromagnet (SAF), as described in U.S. Pat. No. 5,465,185. The AP-pinned structure minimizes magnetostatic coupling of the pinned layer 20 with the free layer 10. The free layer has its magnetization direction 12 oriented either parallel or antiparallel to the magnetization direction 22 of pinned layer 20.

The magnetic state of the MTJ cell is written, i.e., the magnetization direction 12 of free layer 10 is switched between +/−X directions, by write currents passing in X and Y directions through write lines W1, W2, respectively. The write currents generate orthogonal magnetic fields in the X and Y directions that switch the magnetization direction of the selected MTJ cell. The typical writing scheme is a "half-select" scheme, where each of the write lines generates half the required write field for switching the selected MTJ cell. The magnetic state of the MTJ cell is read, i.e., the direction 12 of the free layer magnetization relative to the direction 22 of the pinned layer magnetization is detected, by turning on the transistor and measuring the resistance with the read circuit when a sense current $I_s$ flows through the MTJ cell.

MRAM with multiple memory cells located between the write lines to produce more than two magnetic states, and thus more than two logic states, have been proposed. An example of a memory unit or stack of two memory cells producing four bit states is described in U.S. Pat. No. 5,930,164 and shown in FIG. 3. The memory unit 50 has two memory cells (cell 1 and cell 2) of different lengths and widths, which results in different resistances and anisotropies. The different resistances of the memory cells enable four magnetic states to be detected. Uniaxial magnetic anisotropy of a ferromagnetic layer means essentially that all of the magnetic domains tend to align along the same axis, referred to as the easy axis, which is the lowest energy state. The anisotropy field $H_k$ of a ferromagnetic layer with uniaxial magnetic anisotropy is the magnetic field that would need to be applied along the easy axis to switch the magnetization direction. Thus cell 2 has a higher anisotropy field $H_k$ than cell 1. While the two cells have different anisotropies they have parallel uniaxial anisotropy directions, i.e. parallel to the X axis. The two cells are connected in series by a conductive separation layer. The selective writing of the two cells requires multiple write pulses and write-current values. The high-anisotropy cell (HAC) (the larger cell 2) is written first and then the low-anisotropy cell (LAC) (cell 1) is written, with the LAC being written with a write field sufficient to switch the LAC but not the HAC. The scheme for reading the four magnetic states involves using multiple reference voltages, as described in U.S. Pat. No. 6,169,689 B1.

A problem arises in an MRAM that has memory units of multiple stacked memory cells because as the units become densely packed in the X-Y plane the "half-selected" unit may be switched when a nearby adjacent unit is written. To prevent the half-selected units from switching, the maximum X and Y direction write fields allowed for writing the HACs is capped at the minimum anisotropy ($H_k$) of the LACs sharing the write lines. In addition, the switching field for the LACs has to be kept low enough to not switch the weakest HAC sharing the write lines. As a result of this half-select constraint, the write-current margin is severely degraded. Even assuming the unlikely case where all cells are identical and thus have an identical switching astroid, the write-current window is reduced by about 50% as compared to the conventional single-memory-cell MRAM (FIG. 2). To allow for a +/−25% switching threshold variation among the cells, there is essentially no write-current margin.

Figure 3:
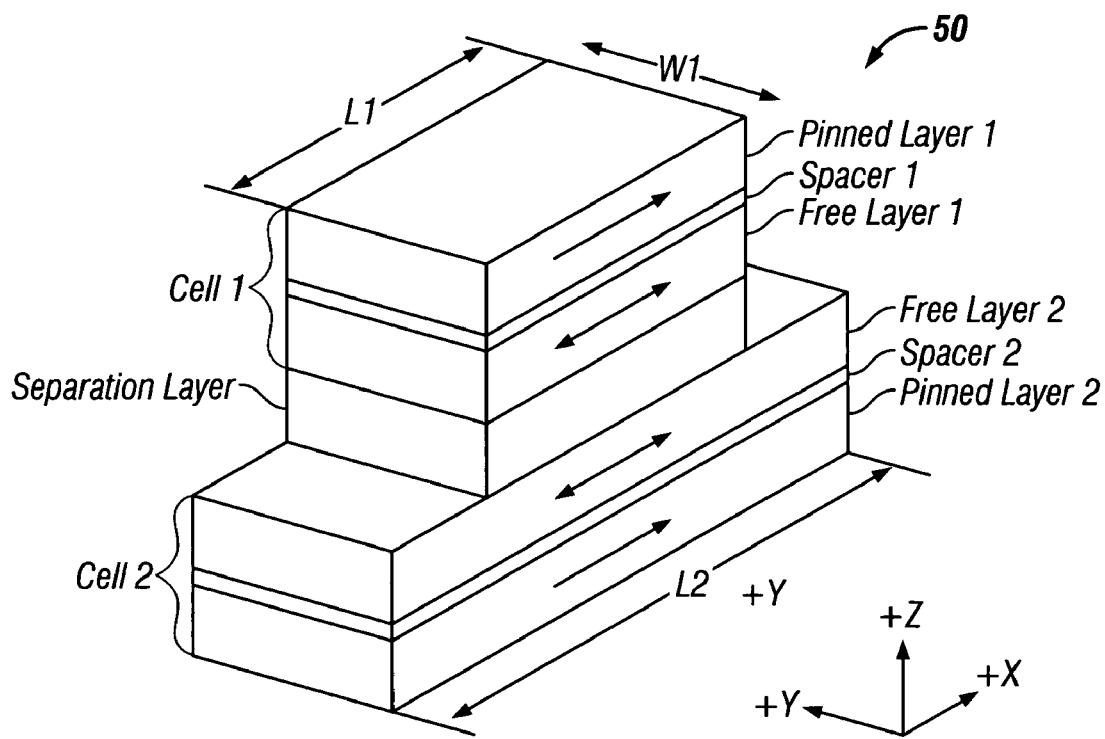
FIG. 3 is a perspective view of a prior art two-cell memory unit or stack with the easy axes of the two cells being parallel, but with the cells having different dimensions, resulting in different resistances and anisotropies.
Figure 4:
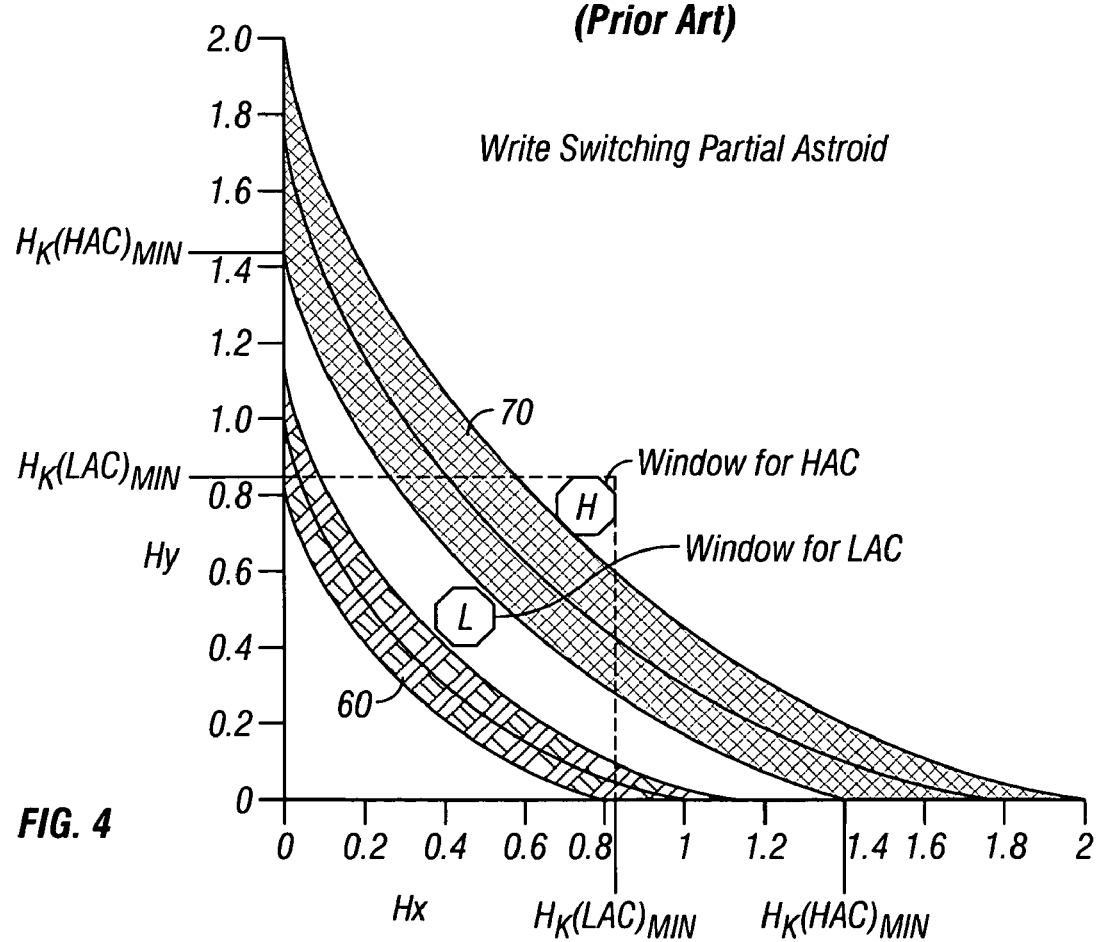
FIG. 4 is the positive X and Y quadrant of a switching astroid showing the write-current windows for the prior art memory unit depicted in FIG. 3.

FIG. 4 shows an example of a partial switching astroid (the positive X and Y quadrant) for a memory unit with multiple memory cells as depicted in FIG. 3. The easy axis of the free layer in each cell is along the X direction so any field greater than $H_k$(LAC) along the X direction will switch the magnetization direction of cell 1, and any field greater than $H_k$(HAC) along the X direction will switch the magnetization direction of cell 2. In FIG. 4, a +/−15% variation of $H_k$ for the cells is assumed for the purpose of illustration. The switching astroid distribution is shown by band 60 for the LAC and band 70 for the HAC. Thus any composite field from a combination of fields along the X and Y directions will switch the magnetization direction of the free layer of the LAC if it is greater than the outer boundary of band 60, and any composite field from a combination of fields along the X and Y directions will switch the magnetization direction of the free layer of the HAC if it is greater than the outer boundary of band 70. The octagonal-shaped regions marked "H" and "L" correspond to the write-current windows for writing the HAC and LAC, respectively. Region "H" is inside the rectangle on FIG. 4 and bounded on the upper end by the X and Y write fields that do not exceed the minimum of $H_k$ for the LAC to ensure to assure that writing does not also switch the magnetizations of the half selected LACs, i.e., $H_X<H_k(LAC)_{MIN}$ and $H_Y<H_k(LAC)_{MIN}$. Region "H" is bounded on the lower end by the X and Y write fields that must exceed the outer boundary of switching astroid band 70 to ensure the successful writing of all HACs. Region "L" is also inside the rectangle in FIG. 4 and well below the X and Y write fields that exceed the minimum of $H_k$ for the LAC to ensure that writing does not also switch the magnetizations of the half selected LACs, i.e., $H_X<H_k(LAC)_{MIN}$ and $H_Y<H_k(LAC)_{MIN}$. Region "L" is bounded on the upper end by the X and Y write fields that would exceed the inner boundary of switching astroid band 70 to assure that writing to the LACs does not also switch the magnetizations in the HACs. Region "L" is bounded on the lower end by X and Y write fields that must exceed the outer boundary of switching astroid band 60 to ensure the successful writing of all LACs. Thus the composite of write fields $H_X$ and $H_Y$ needs to be above the maximum LAC astroid band 60 to assure writing of LACs and below the minimum HAC astroid band 70 to avoid switching the magnetizations of the HACs. As can be seen from the "L" and "H" regions in FIG. 4, there are relatively narrow operating windows available to reliably write to an MRAM with memory units composed of multiple memory cells according to the prior art.

The Invention

Figure 5A:
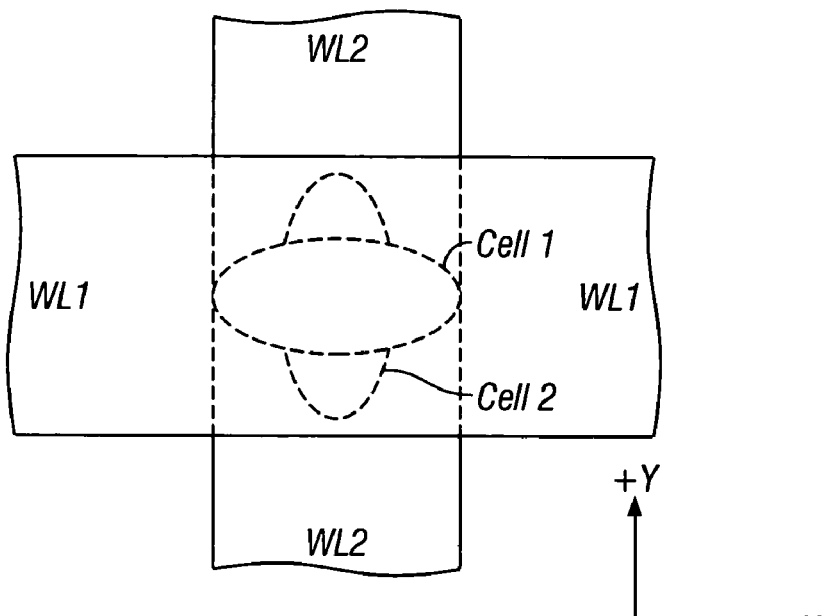
FIG. 5A is a top view of a two-cell memory unit according to the present invention with the easy axes of the two cells being substantially orthogonal and the write lines directly above and below the cells.

The invention is an MRAM having memory units of stacked memory cells in each intersection region, but in which the memory cells in the unit have nonparallel uniaxial anisotropy orientations. FIG. 5A is a top view of a multiple-memory-cell stack in an intersection region between two write lines WL1 and WL2. The memory unit has two MTJ cells 1 and 2, with cell 1 depicted on top of cell 2. Cell 1 has its free layer easy axis aligned along the X axis and cell 2 has its easy axis aligned substantially orthogonal to the easy axis of the free layer of cell 1 and along the Y axis. The two cells have substantially the same anisotropy field $H_k$. Each cell is depicted as having a generally elliptical shape, which is meant to represent that the cell's free layer has shape anisotropy with the long axis being the easy axis (parallel to the X axis for cell 1 and parallel to the Y axis for cell 2) and the short axis (the axis perpendicular to the long axis) being the hard-axis. Numerous other shapes besides the elliptical shape are possible to provide uniaxial anisotropy induced by the shape of the cell.

Figure 5B:
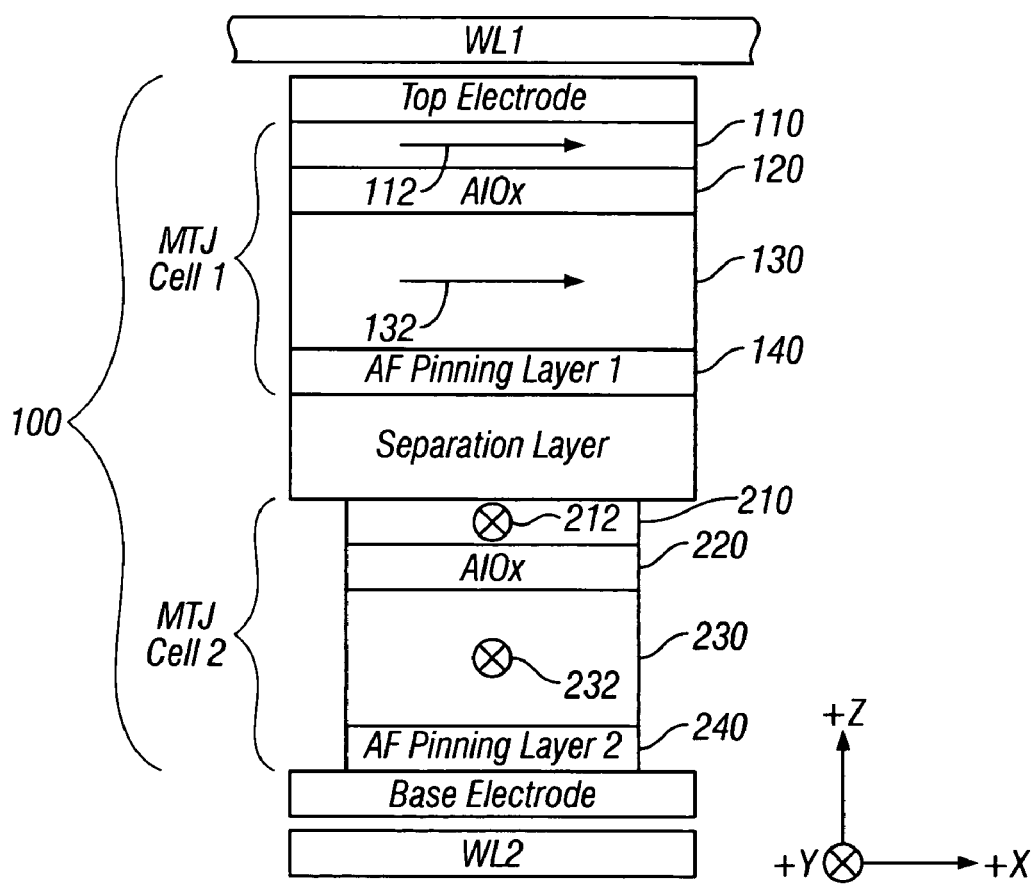
FIG. 5B is a sectional schematic showing the layers making up the two-cell memory unit depicted in FIG. 5A.

FIG. 5B is a sectional schematic showing the layers making up the two MTJ cells in the memory unit 100. The two cells are substantially similar, but cell 1 is stacked on top of cell 2 with a nonmagnetic separation layer between the two cells. Cell 1 has a free layer 110 and a pinned layer 130 separated by a tunnel barrier 120. Cell 2 has a free layer 210 and a pinned layer 230 separated by a tunnel barrier 220. The tunnel barriers 120, 220 are typically formed of alumina ($Al_2O_3$). The free layer 110 has its magnetization direction 112 oriented parallel to the X axis and either parallel or antiparallel to the magnetization direction 132 of pinned layer 130, with the magnetization direction 132 being pinned by pinned layer 130 being exchange coupled to antiferromagnetic (AF) layer 140. The free layer 210 has its magnetization direction 212 oriented parallel to the Y axis and either parallel or antiparallel to the magnetization direction 232 of pinned layer 230, with the magnetization direction 232 being pinned by pinned layer 130 being exchange coupled to antiferromagnetic (AF) layer 240. The pinned layers 130, 230 may be conventional single ferromagnetic layers or AP-pinned structures. A relatively wide range of materials and thicknesses are known for use in MTJ memory cells, but representative examples are 2–4 nm of CoFe or CoFe/NiFe bilayers for the ferromagnetic free layers, 5 to 15 nm of IrMn or PtMn for the AF pinning layers, and 0.5–3.0 nm of alumina ($Al_2O_3$) for the tunnel barriers. While not depicted in FIG. 5B, seed layers may be located beneath the AF pinning layers and a capping layer may be located beneath the top electrode. The nonmagnetic separation layer can be a nonmagnetic electrically-conductive material such as Cu or NiCu with a thickness of approximately 10 to 100 nm. The nonmagnetic separation layer provides electrical connection between the two cells while magnetically separating the two cells and physically separating the free layer of cell 2 from the AF pinning layer of cell 1. The nonmagnetic separation layer can be relatively thin. However, in the case of separate lithographic patterning processes used for the two cells, a thicker separation layer can be used to provide a process end-point buffer. The memory cells in FIG. 5B are depicted as MTJ cells, in which case the nonmagnetic coupling layers that couple the pinned and free ferromagnetic layers are the insulating tunnel barriers. However, other types of memory cells have been proposed, such as current-perpendicular-to-the-plane spin valve (CPP-SV) memory cells, in which case the nonmagnetic coupling layers are electrically conducting spacer layers, typically Cu.

The fabrication of the MRAM with the memory units of FIG. 5B begins with the MRAM wafer having WL2 and the base electrode already formed on it. A suitable seed layer is deposited on the base electrode layer, followed by deposition of the AF pinning layer 240 and the pinned layer 230. The tunnel barrier 220 of MTJ cell 2 is then formed by deposition of an aluminum film followed by oxidation to form the alumina tunnel barrier. The free layer 210 and the nonmagnetic separation layer are then deposited over the tunnel barrier 220.

The layers forming both the pinned layer 230 and the free layer 210 in MTJ cell 2 are deposited in the presence of a magnetic field aligned with the easy axis of cell 2 (parallel to the Y axis), which defines the overall magnetization direction of cell 2, including the magnetization direction of the AF pinning layer 240. The wafer is then annealed in the presence of the magnetic field at temperatures around 200–300° C. to set and improve the temperature dependence of the exchange coupling. Next, the wafer is lithographically patterned and etched to define the shape of MTJ cell 2, and thereby form its uniaxial shape anisotropy. After the patterning, etching, and resist removal, an insulating material, such as alumina, is used to refill the areas removed by etching. This is followed by a chemical-mechanical polishing (CMP) process to planarize the wafer and expose the nonmagnetic separation layer. This completes the fabrication process for MTJ cell 2. The process for fabricating MTJ cell 1 on top of the separation layer is essentially the same as for MTJ cell 2 except that the deposition occurs in a magnetic field aligned with the easy axis of cell 1 (parallel to the X axis). This fabrication process results in MTJ cells with the pinned layers located below the tunnel barriers, but one or both of the MTJ cells can be formed with the free layer located below the tunnel barrier. It is preferred that the AF pinning layer 140 of cell 1 have a lower blocking temperature than that of the AF pinning layer 240 of cell 2. This provides more process flexibility in achieving the two different pinning directions for the two cells. The top electrode and write line 2 (WL2) are then patterned on top of MTJ cell 1.

Figure 6A:
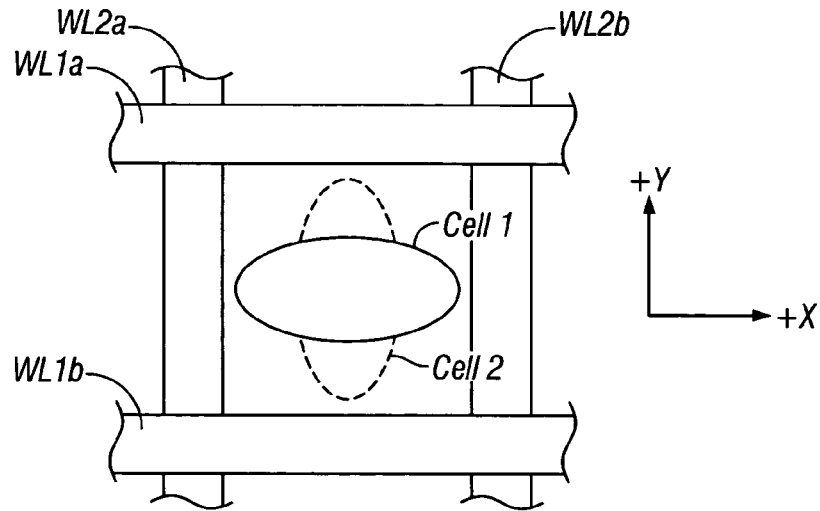
FIG. 6A is a top view of a two-cell memory unit according to the present invention with the easy axes of the two cells being substantially orthogonal and each write line being a pair of coplanar write lines spaced on the sides of the memory unit near the top and bottom of the unit.
Figure 6B:
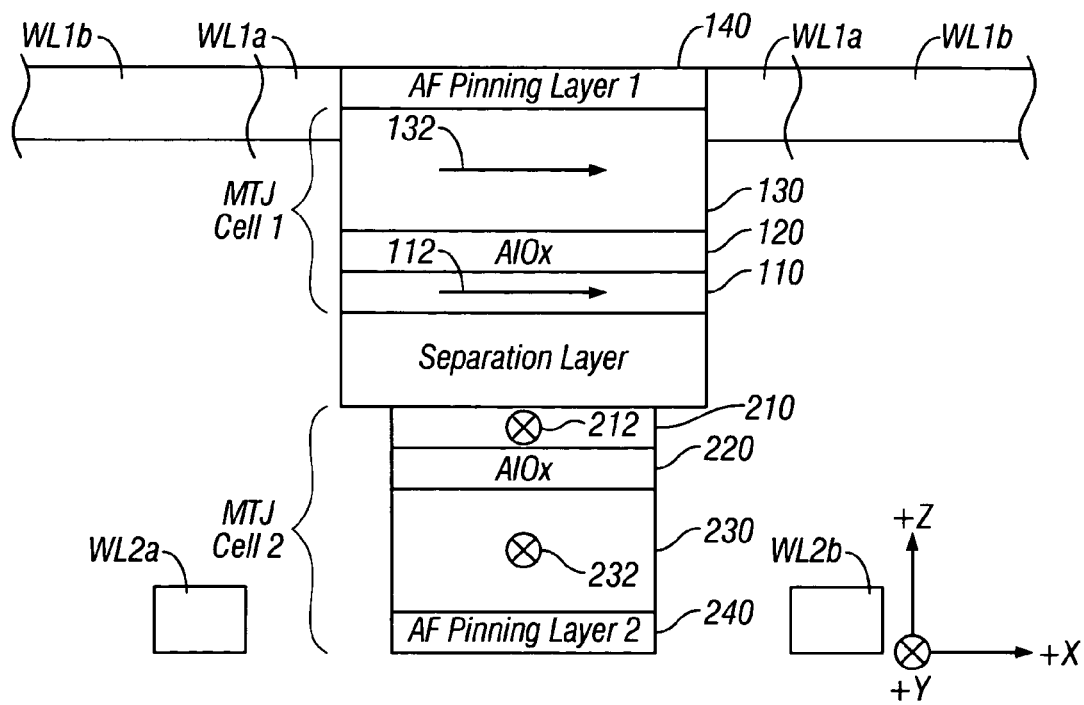
FIG. 6B is a sectional schematic showing the layers making up the two-cell memory unit depicted in FIG. 5A.

FIGS. 5A and 5B depict the write lines WL1 and WL2 directly above and below the cells and aligned with the X and Y axes, respectively. However, each write line can be a pair of coplanar write lines spaced on the sides of the memory unit, near the top and bottom of the unit, with the memory cells located in the intersection region between the top and bottom pairs of overlapping write lines, as depicted in FIGS. 6A–6B. The memory unit of FIG. 6B also differs from the memory unit of FIG. 5B in that memory cell 1 has its free layer 110 located below the tunnel barrier 120. Thus, write line 2 can be a pair of coplanar write lines WL2a, WL2b spaced on the sides of bottom memory cell 2 and aligned parallel to the Y axis, and write line 1 can be a pair of coplanar write lines WL1a, WL1b spaced on the sides of top memory cell 1 and aligned parallel to the X axis. Write current directed in the same direction in WL1a and WL1b will generate a magnetic field along the Y axis substantially in the planes of the free layers 110, 210 in the memory unit, and write current directed in the same direction in WL2a and WL2b will generate a magnetic field along the X axis substantially in the planes of the free layers 110, 210 in the memory unit.

An alternative fabrication process for the memory unit with multiple memory cells does not rely on shape anisotropy of the cells and thus reduces the number of process steps and manufacturing cost. It is known that uniaxial anisotropy of the ferromagnetic free layer can be defined with the applied magnetic field during the deposition. The magnitude of the anisotropy can be quite high in certain materials, such as CoFeB and CoFeHf. Also, it has been reported by Pugh et al, *IBM Journal of Research & Development,* Vol. 4, No. 2, p. 163 (1960), that high uniaxial anisotropy can be obtained in NiFe by controlling the angular incident angle in an ion beam deposition or evaporator system. By orienting the wafer relative to the magnetic field direction and/or the incident beam angle, the anisotropy angle can be defined by deposition rather than by lithographic patterning. In this case the layers making up the two memory cells can be deposited in a single pump-down while achieving different controlled anisotropy directions for the free layers and corresponding magnetization directions for the pinned layers. If the uniaxial anisotropy of the cells is defined by a material deposition scheme, such as angular incidence, the cells can have the same shape and matching perimeters that are aligned in the Z-direction. One example would be circular-shaped cells. The uniaxial anisotropy directions for cells 1 and 2 can thus defined by depositing the free layers for cells 1 and 2 at different angular incident angles. With this fabrication approach, both cells can be fabricated with the same lithographic patterning steps. A circular geometry also allows the memory units to be packed closer together in the X-Y plane.

Figure 7:
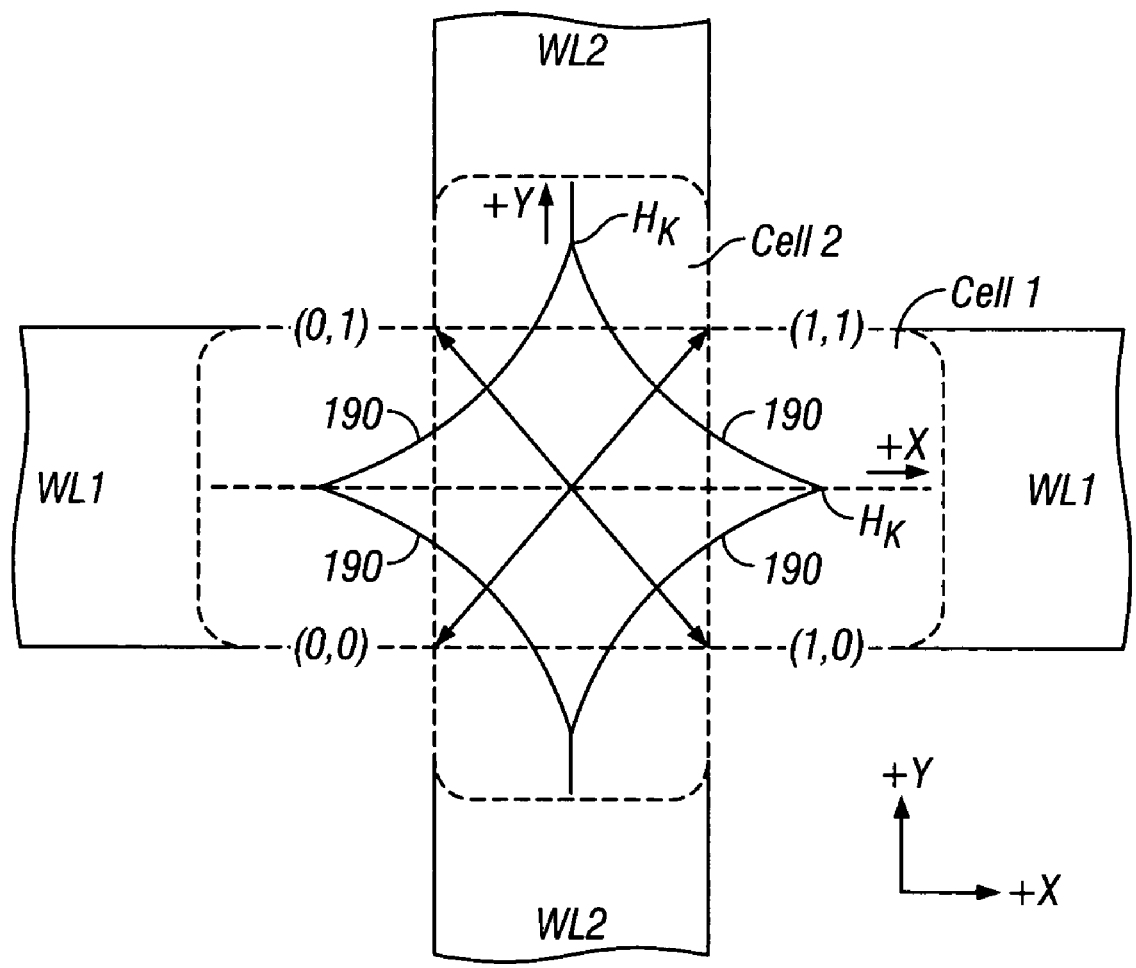
FIG. 7 shows a two-cell memory unit according to the present invention with the hard and easy axes of magnetization of the two cells superimposed on a switching astroid.

In this invention the writing of a memory cell occurs by applying magnetic fields along both the easy axis and hard axis of the selected cell, with each field being less than the minimum of the anisotropy field $H_k$. The write circuitry is capable of generating bidirectional write-current pulses. Both memory cells are "written" at the same time. The writing method will be explained by referring to FIG. 7, which shows the memory cells 1 and 2 superimposed on a switching astroid. In FIG. 7 the cells have a generally rectangular shape with rounded corners with the long rectangular axis being the easy axis. The easy axis of cell 1 is along the X direction so if a field greater than $H_k$ were applied along the X direction it would switch the magnetization direction of cell 1. Similarly, the easy axis of cell 2 is along the Y direction so if a field greater than $H_k$ were applied along the Y direction it would switch the magnetization direction of cell 2. Any net or composite field from a combination of fields along the X and Y directions will switch the magnetization direction of one of the cells if the composite field is greater than the outer boundary 190 of the astroid. For example, if equal write-current pulses of sufficient magnitude are applied in the +Y direction in WL2 and the +X direction in WL1 to generate equal fields along the +X and +Y directions, respectively, so that the composite field is greater than the switching astroid boundary 190 at a 45 degree angle between +X and +Y, then the resulting magnetization of cell 1 will be +X and the resulting magnetization of cell 2 will be +Y, or the magnetic states of the two cells in the pair will be (1, 1). Similarly, if equal write-current pulses of sufficient magnitude are applied in the −Y direction in WL2 and the −X direction in WL1 to generate equal fields along the −X and −Y directions, respectively, so that the composite field is greater than the switching astroid boundary 190 at a 45 degree angle between −X and −Y, then the resulting magnetization of cell 1 will be −X and the resulting magnetization of cell 2 will be −Y, or the magnetic states of the two cells in the pair will be (0, 0). The resulting magnetic states are shown in FIG. 7 for the other four quadrants of the astroid, resulting in the other three bit combinations [(1,0), (0,0) and (0,1)] for the pair of cells. By applying X and Y write-current pulses of the same magnitude in the desired direction it is possible to write both cells at the same time. This decreases the write time by a factor of two over the prior art.

Figure 8:
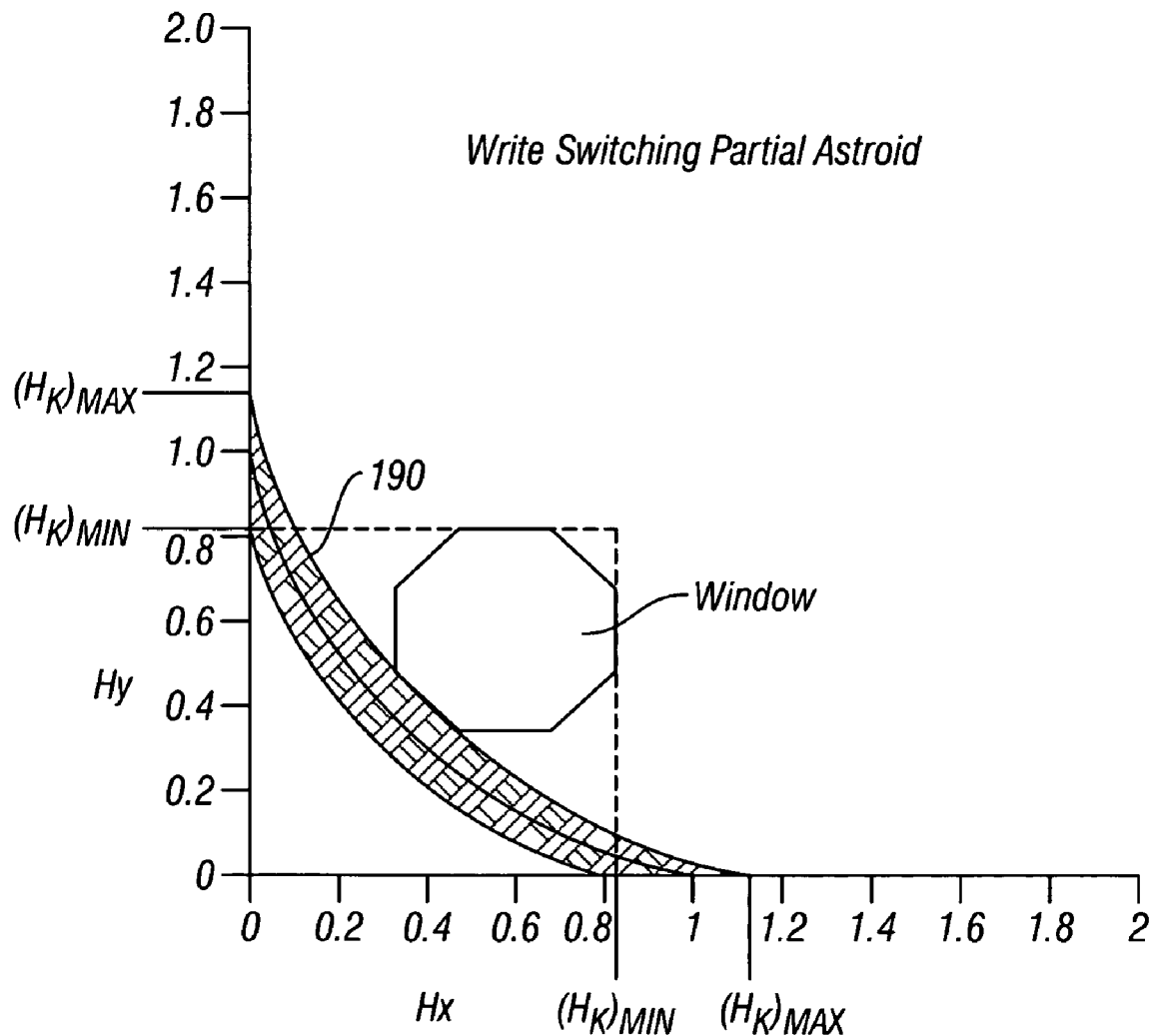
FIG. 8 is the positive X and Y quadrant of a switching astroid showing the write-current window for a memory unit according to the present invention.

FIG. 8 shows an example of a partial switching astroid (the positive X and Y quadrant) for a memory unit with multiple memory cells according to the present invention. In FIG. 8, a +/−15% variation of $H_k$ for the cells is assumed for the purpose of illustration and comparison with the prior art example shown in FIG. 4. This results in a band having an outer boundary 190 as the partial switching astroid. The octagonal-shaped region corresponds to the write-current window. The window is bounded at the upper end by X and Y write fields that do not exceed the minimum of $H_k$ for all cells, i.e., $H_X<(H_k)_{MIN}$ and $H_Y<(H_k)_{MIN}$ to prevent switching the magnetizations of the cells in half-selected memory units. The window is bounded at the lower end by X and Y write fields that need to be above the outer astroid boundary 190 $(H_k)_{MAX}$ to assure writing of all cells. The write-field margin and the sensitivity to the switching threshold distribution are essentially the same as for the conventional single-memory-cell and thus substantially improved over the prior art.

The invention has been described with the easy axes of the free layers in the memory cells in a memory unit being aligned parallel with corresponding write lines. However, the easy axes do not need to be aligned exactly parallel with the write lines but can be only generally parallel so long as the angular spacing is close enough to assure writing occurs as explained with the switching astroid of FIG. 7. Similarly, the invention has also been described with the easy axes of the free layers in the memory cells in a memory unit being orthogonal to one another. However, the easy axes do not need to be aligned exactly 90 degrees apart so long as they are substantially nonparallel, i.e., greater than 45 degrees and less than or equal to 90 degrees apart, provided their angular alignment enables writing in the manner explained with the switching astroid of FIG. 7.

Each MTJ cell in the two-memory-cell unit can be a "1" or a "0", so there are four possible magnetic states for the unit. These states are represented by (cell 1 state, cell 2 state) as (1,1), (1,0), (0,1) and (0,0). If the two cells have the same resistance difference, ΔR, between the "1" and "0" states, a conventional comparator can only detect 3 resistance levels instead of the 4 needed. However, by fabricating cell 1 and cell 2 with different MTJ materials so that the cells have different ΔR values, four distinguishable resistance levels can be detected. For example, if ΔR of cell 1 is at least twice the ΔR of cell 2 the four states can be determined from the four net resistance levels, with the highest resistance being (1,1) followed by (1,0), (0,1) and (0,0). Published patent application US20020036331A1 describes an MRAM with a memory unit of two stacked conventional MTJ cells in which the ferromagnetic layers in the cells have different coercivities so that the cells have different ΔR values. The logic state of this memory unit is read by applying a voltage across it and determining the magnitude of a sense current that flows through the memory cell, with the magnitude of the sense current being proportional to the total resistance of the two series-connected MTJ cells. Different ΔR values of the two MTJs cells can also be achieved by fabricating the cells with different tunnel barrier thicknesses. This is readily achievable because the resistance-area product (RA) for magnetic tunnel junctions can be made to span 2–3 orders of magnitude for a given barrier material. For example, while the typical MTJ cell for an MRAM has a RA of approximately 1 k$\Omega$ $\mu m^2$ the typical MTJ for a magnetoresistive sensor for recording head applications has RA well below 5 $\Omega \mu m^2$. The advantage of making the cells have different ΔR values by varying the tunnel barrier thickness is that the magnetic properties of the free layers for the two MTJ cells can still be made nearly the same.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic random access memory (MRAM) comprising:
 a generally planar substrate;
 a plurality of first and second electrically conductive lines on the substrate, the second lines being located between the substrate and the first lines with the first lines overlapping the second lines and spaced from the second lines in a generally perpendicular direction from the substrate to define a plurality of intersection regions, the first line and second line at each intersection region being generally orthogonal wherein each of the first lines comprises a pair of coplanar spaced lines lying in a plane substantially parallel to the substrate, each of the second lines comprises a pair of coplanar spaced lines lying in a plane substantially parallel to the substrate, and the region between the overlapping pairs of coplanar lines is an intersection region; and
 a plurality of memory stacks, each memory stack located in an intersection region and comprising (a) a first memory cell having a pinned ferromagnetic layer, a free ferromagnetic layer with an in-plane easy axis of magnetization aligned generally parallel with one of said first and second lines, and a nonmagnetic coupling layer between the pinned and free layers, (b) a second memory cell having a pinned ferromagnetic layer, a free ferromagnetic layer with an in-plane easy axis of magnetization aligned substantially nonparallel with the easy axis of magnetization of the free layer of the first cell, and a nonmagnetic coupling layer between the pinned and free layers, and (c) a nonmagnetic separation layer between said two memory cells.

2. The MRAM of claim 1 wherein the substrate is parallel to the X-Y plane of an X-Y-Z coordinate system and a direction perpendicular to the substrate is parallel to the Z axis, wherein the first lines are mutually parallel and parallel to the X axis, the second lines are mutually parallel and parallel to the Y axis, and the memory cells in each memory stack are stacked parallel to the Z axis.

3. The MRAM of claim 1 wherein each of the memory cells is a magnetic tunnel junction (MTJ) cell and wherein each nonmagnetic coupling layer is a tunnel barrier.

4. The MRAM of claim 1 wherein each memory cell has an electrical resistance difference ΔR between the parallel and antiparallel alignment of its free and pinned layer magnetization directions, and wherein the ΔR of the first memory cell is substantially different from the ΔR of the second memory cell.

5. The MRAM of claim 4 wherein each memory cell is a magnetic tunnel junction (MTJ) cell and each nonmagnetic coupling layer is a tunnel barrier, and wherein the tunnel barrier thickness of the first MTJ cell is substantially different from the tunnel barrier thickness of the second MTJ cell.

6. The MRAM of claim 1 wherein the easy axes of magnetization of the free layers of the first and second cells in each memory stack are aligned substantially orthogonal to each other.

7. The MRAM of claim 1 wherein the easy axis of magnetization of the free layer in each cell is the axis of anisotropy induced by the shape of the cell.

8. The MRAM of claim 1 wherein the easy axis of magnetization of the free layer in each cell is the axis of anisotropy induced during deposition of the free layer, and wherein the first and second cells have the same shape and matching perimeters.

9. The MRAM of claim 8 wherein the memory cells have a circular shape.

10. The MRAM of claim 1 wherein the pinned layer in each memory cell is an AP-pinned layer.

11. The MRAM of claim 1 further comprising a plurality of transistors between the substrate and the second lines, and wherein each memory stack is electrically connected to a transistor.

12. The MRAM of claim 11 further comprising circuitry coupled to the transistors for detecting the electrical resistance across the memory stacks.

13. The MRAM of claim 1 further comprising write circuitry for directing electrical current bidirectionally to the first and second lines.

14. A magnetic random access memory (MRAM) comprising:
 a substrate parallel to an X-Y plane of an X-Y-Z coordinate system;
 a plurality of memory units on the substrate and aligned parallel to the Z axis, each memory unit comprising (a) a first magnetic tunnel junction (MTJ) cell having a free ferromagnetic layer with an easy axis of magnetization aligned in an X-Y plane generally parallel to one of said X and Y axes, (b) a second magnetic tunnel junction (MTJ) cell having a free ferromagnetic layer with an easy axis of magnetization aligned in an X-Y plane at an angle substantially orthogonal to the easy axis of magnetization of the free layer of the first cell, and (c) a nonmagnetic separation layer between said first and second cells;
 a plurality of first pairs of electrically conductive coplanar spaced lines lying in an X-Y plane and substantially parallel to the X axis;

a plurality of second pairs of electrically conductive coplanar spaced lines lying in an X-Y plane and substantially parallel to the Y axis, each memory unit being located between the first and second pairs of lines; and write circuitry coupled to the first and second pairs of lines for directing electrical current to the first and second pairs of lines.

15. The MRAM of claim 14 wherein the easy axis of magnetization of the free layer in each cell is the axis of anisotropy induced by the shape of the cell.

16. The MRAM of claim 14 wherein the easy axis of magnetization of the free layer in each cell is the axis of anisotropy induced during deposition of the free layer, and wherein the first and second cells have the same shape and matching perimeters.

17. The MRAM of claim 14 wherein each cell has an electrical resistance difference ΔR between two antiparallel orientations of its free layer magnetization, and wherein the ΔR of the first cell is substantially different from the ΔR of the second cell.

18. The MRAM of claim 14 further comprising a plurality of transistors on the substrate, and wherein each memory unit is electrically connected to a transistor.

19. The MRAM of claim 18 further comprising read circuitry coupled to the transistors for detecting the electrical resistance across the memory units.

20. The MRAM of claim 17 wherein the write circuitry provides bidirectional current on the first and second lines.

21. A method for writing simultaneously a pair of magnetic tunnel junction (MTJ) memory cells on a the substrate of a magnetic random access memory (MRAM), the MRAM substrate being parallel to an X-Y plane of an X-Y-Z coordinate system, the MRAM having X and Y electrically conductive write lines and the pair of memory cells being in a stack extending from the substrate along the Z axis, the stack comprising a first MTJ cell having a free ferromagnetic layer with an easy axis of magnetization aligned in an X-Y plane generally parallel to the Y axis, a second MTJ cell having a free ferromagnetic layer with an easy axis of magnetization aligned in an X-Y plane generally parallel to the X axis the first and second MTJ cells having substantially the same anisotropy field between $H_k(MIN)$ and $H_k(MAX)$, and a nonmagnetic separation layer between said first and second MTJ cells, the method comprising:

applying in the X write line an electrical write-current pulse having a magnitude to generate a magnetic field less than $H_k(MIN)$ and simultaneously applying in the Y write line an electrical write-current pulse of substantially the same magnitude, the write-current pulse magnitude being selected such that the composite magnetic field in the presence of both write-current pulses at an angle approximately 45 degrees between the X and Y axes is greater than $H_k(MAXV)$; and prior to applying the simultaneous write-current pulses, selecting the current direction in the X and Y write lines to thereby select one of four magnetic states for the pair of MTJ cells.

* * * * *